United States Patent [19]
Martin et al.

[11] 4,106,279
[45] Aug. 15, 1978

[54] WRIST WATCH INCORPORATING A THERMOELECTRIC GENERATOR

[75] Inventors: Jean-Claude Martin; Christian Piguet, both of Neuchatel, Switzerland

[73] Assignee: Centre Electronique Horloger S.A., Neuchatel, Switzerland

[21] Appl. No.: 683,949

[22] Filed: May 6, 1976

[30] Foreign Application Priority Data

May 7, 1975 [CH] Switzerland ................. 5879/75

[51] Int. Cl.² .............................................. G24C 5/00
[52] U.S. Cl. .................................. 58/23 BA; 58/23 C; 58/88 R
[58] Field of Search ............... 58/23 R, 23 BA, 23 C, 58/88 R; 136/203, 204; 307/46, 49; 310/4 R; 320/2, 39, 59; 321/1.5

[56] References Cited

U.S. PATENT DOCUMENTS

| | | | |
|---|---|---|---|
| 2,978,861 | 4/1961 | Smulski | 58/23 C |
| 3,879,229 | 4/1975 | Gilbert | 136/208 |
| 3,924,172 | 12/1975 | Gregorich | 321/2 |
| 3,974,636 | 8/1976 | Kamita | 58/23 R |

FOREIGN PATENT DOCUMENTS

144/75   6/1975   Japan.

*Primary Examiner*—Robert K. Schaefer
*Assistant Examiner*—Vit W. Miska
*Attorney, Agent, or Firm*—Cushman, Darby & Cushman

[57] ABSTRACT

An electric wrist watch including a case containing a timekeeping module, an electrical storage device, and a display device. The case also includes a thermoelectric generator in contact with two heat exchangers. The two heat exchangers are arranged such that they are at least temporarily at different temperatures, with one of the heat exchangers being in contact with the surrounding air.

9 Claims, 16 Drawing Figures

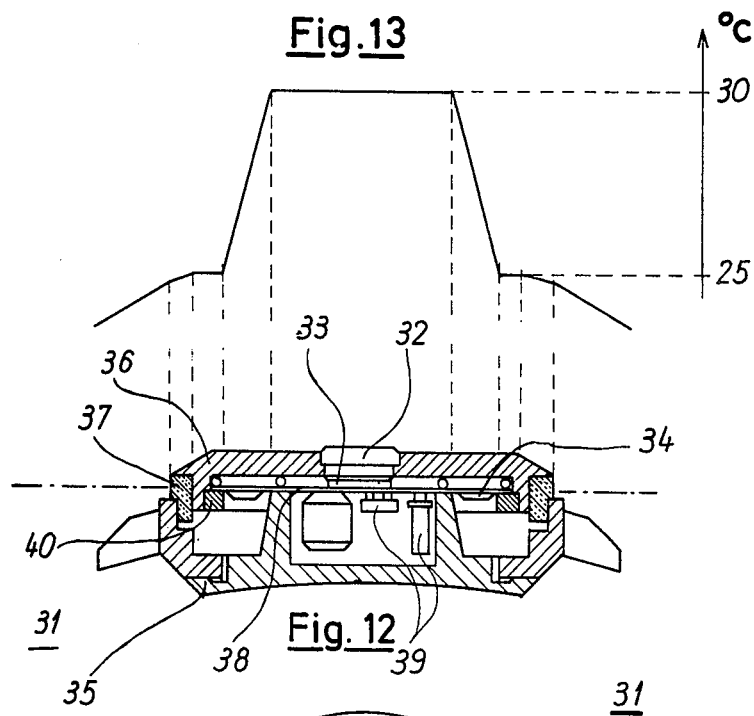
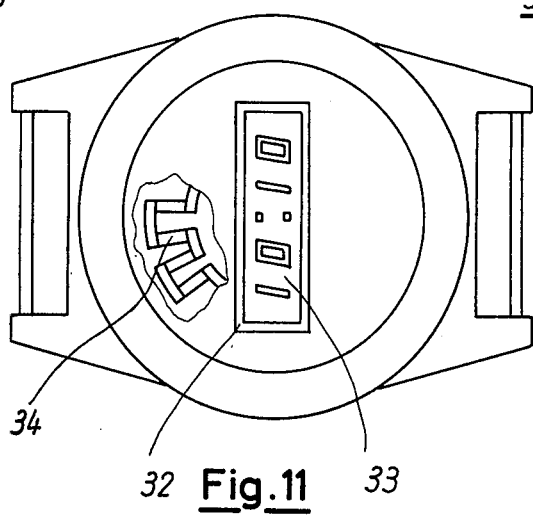

WRIST WATCH INCORPORATING A THERMOELECTRIC GENERATOR

BACKGROUND OF THE INVENTION

The present invention relates to an electric wrist watch of the type comprising a case in which are placed a timekeeping module, an electrical storage capacity such as a battery, and a display device.

Known electric watches usually comprise a non-rechargeable battery intended to power the timekeeping module and display device. Despite the considerable increase in storage capacity of these microbatteries and the reduction of the current consumption by quartz watches, thanks to modern technological means, the life of the batteries is limited.

OBJECTS AND SUMMARY OF THE INVENTION

The present invention has the purpose of achieving an electric wrist watch for which the life of the electrical supply is considerably increased. This purpose is achieved by using, to power the movement, electric energy obtained by conversion of thermal energy in accordance with the second principle of thermodynamics. The second principle of thermodynamics indicates that it is possible to transform thermal energy into mechanical or electrical energy, if two heat sources at different temperatures are available. A watch, based on this principle in accordance with the invention, will hereafter be called a dithermal watch.

The wrist watch according to the invention is characterized in that it comprises a thermoelectric generator in contact with two heat exchangers which are at least momentarily at different temperatures, one of the heat exchangers being in thermal contact with the surrounding air.

It is known that thermoelectric modules or Peltier elements make possible a conversion between thermal energy and electrical energy. Of them, thermoelectric generators supply electrical energy from thermal energy, while thermoelements produce a temperature difference from electrical energy and are often used for cooling. Thermoelectric modules are well known and are described more in detail, as are their functioning and some of their applications in "Semiconductor Thermoelements and Thermoelectric Cooling" by A. F. Ioffe, published by Inforsearch Ltd. London in 1957; "Application of Thermoelectricity" by H. J. Goldsmid, published in 1960; and "Thermoelectric Power Modules" published in 1963 by the U.S. Department of Commerce.

Thermoelements are found on the market. One such example are those sold under the name "Microship Elements" by the Etablissements Cogie in France.

It is the principal object of this invention to provide a wrist watch which includes a thermoelectric generator and wherein all functional elements including the thermoelectric generator are incorporated in the watch itself.

According to a preferred embodiment of the invention, the watch case is made up of at least two metallic parts, each acting as a heat exchanger and separated by a thermal insulating joint. An upper part in contact with the ambient air serves as a cold source, while a lower part in contact with the wearer's wrist serves as a hot source. These heat exchangers are preferably metallic and have as large a surface as possible.

The thermoelectric generator comprises a plurality of Peltier elements connected in series and placed on several concentric circles, each element being approximately perpendicular to the surfaces of contact of the thermoelectric generator with the heat exchangers.

According to another embodiment, the Peltier elements are placed radially flat on an insulating surface in a ring shape. This arrangement makes possible fabrication using well known photolithographic techniques.

According to another variant, one of the heat exchangers comprises the unit of the case thermally insulated in relation to the wearer's wrist, the other heat exchanger comprising a mass with thermal inertia, acting as a delay source, which is placed on the inside of the case and thermally insulated in relation to it. The mass is preferably made up of a metallic plate whose thermal inertia can be increased by connecting it to the timekeeping module and electrical storage capacity unit.

To permit recharging of the storage capacity unit by means of the relatively low output voltage of the thermoelectric generator, the wrist watch comprises also a voltage boosting device connected between the thermoelectric generator and the storage capacity unit. The voltage boosting device comprises a chopping system made up of two MOS transistors, a center-tapped transformer and a rectifier.

The invention constitutes a power source applicable to any type of electric or electronic watch. It is especially suitable for quartz watches whose display is with liquid crystals, by reason of their slight power consumption and the slight surface that they occupy, thus leaving maximum space for the heat exchanger in contact with the surrounding air.

BRIEF DESCRIPTION OF THE DRAWINGS

The present invention will be better understood with reference to the detailed description of exemplary preferred embodiments thereof taken in conjunction with the accompanying drawings in which:

FIG. 11 represents another exemplary embodiment of a dithermal watch according to the invention;

FIG. 12 is a view in vertical section of the dithermal watch according to FIG. 11;

FIG. 13 is a diagram of the temperatures in the various parts of the watch according to FIG. 12;

DETAILED DESCRIPTION

Figures 1, 2:
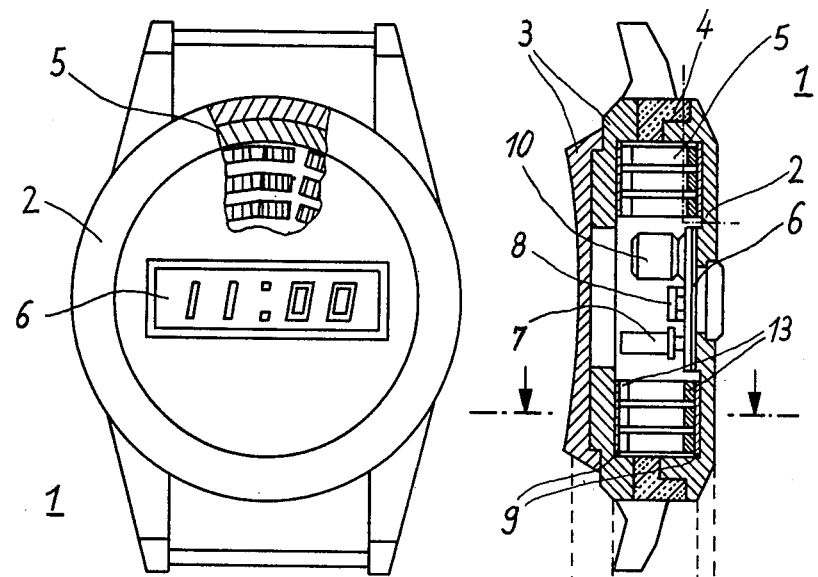
FIG. 1 is a front view of one embodiment of the wrist watch according to the invention.
FIG. 2 is a view in vertical section of the wrist watch of FIG. 1.

Turning now to FIGS. 1 and 2, a dithermal wrist watch in accordance with one embodiment of the invention comprises a case 1 made up of a bezel-caseband 2, and a back 3, separated by a thermal insulating gasket 4. The bezel-caseband 2, preferably of metal, serves as a heat exchanger between a thermoelectric generator 5 and the surrounding air which constitutes the cold source. Back 3, also preferably made of metal, acts as a heat exchanger between thermoelectric generator 5 and the wearer's wrist, this latter performing the role of heat source. The heat exchangers are formed to have as large an outside surface as possible, one to increase the heat dissipated by the air, the other to increase the heat absorbed at the wrist. The heat exchangers conduct the heat to the two opposite surfaces of the thermoelectric generator 5. The contact surfaces on the inside of the watch, between thermoelectric generator 5 and heat exchangers 2 and 3, can be relatively small. Indication of time is preferably realized by means of a liquid crystal display device 6.

The timekeeping module comprising, for example, a quartz element 7 and an electronic module 8 is placed inside the thermoelectric generator 5 of annular shape. As described in more detail below, generator 5 comprises semiconductor elements connected to each other by metallic parts 13. The upper and lower faces thereof are in thermal contact respectively with heat exchangers 2 and 3. A thin layer of electric insulator 9, for example a sheet of mica, a layer of lacquer or silicone grease, separates the plane surfaces of thermoelectric generator 5 from the two heat exchangers. An auxiliary battery 10 supplies power when the thermoelectric source is insufficient.

Figure 3:
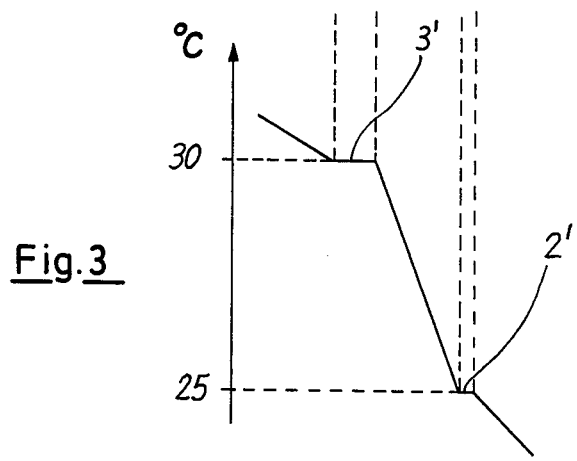
FIG. 3 represents, by way of example, a temperature diagram illustrating the temperature levels in the various parts of the watch of FIG. 1.

FIG. 3 represents a diagram of the temperatures (° C) in the various parts of the dithermal watch of FIGS. 1 and 2. The outside surface of heat exchanger 2 is at the temperature of the surrounding air, which constitutes the cold source represented schematically by stage 2'. The lower surface of heat exchanger 3 is at the temperature of the wearer's wrist, which constitutes the hot source, represented schematically by stage 3'. Insulator 4 and thermoelectric generator 5, in contact with the two heat exchangers 2 and 3, have a non-uniform temperature between about 25° and 30° C.

Figure 4:
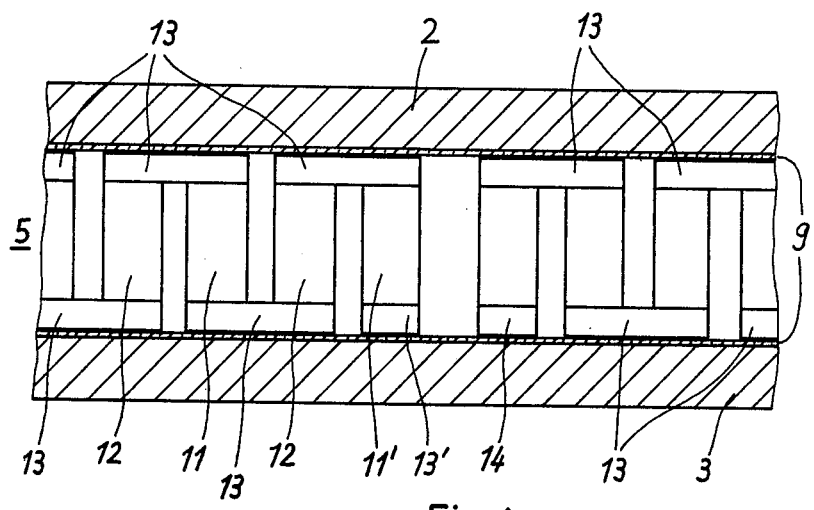
FIG. 4 is a view in partial section of the thermoelectric generator, showing two Peltier couples.

FIG. 4 represents the thermoelectric generator of the dithermal watch of FIG. 1. It comprises a series of semiconductor Peltier elements arranged in one or more stages. A Peltier element is made up of a unit 11 of a p or n type conductivity semiconductor material and a unit 12 of a semiconductor of the other type (n or p) connected by a conductive plate 13. Units 11 and 12 are soldered to conductors 13, which gives this connection a good electrical and thermal conductivity. The semiconductive materials are selected so as to have a maximum thermoelectric output (see the prior art references referred to hereinabove), for example, a compound of $Bi_2Te_3$ and $Sb_2Te_3$. Conductors 13 of thermoelectric generator 5 are in thermal contact with the two heat exchangers 2 and 3, but are insulated from them electrically by a thin insulating layer 9.

Figure 5:
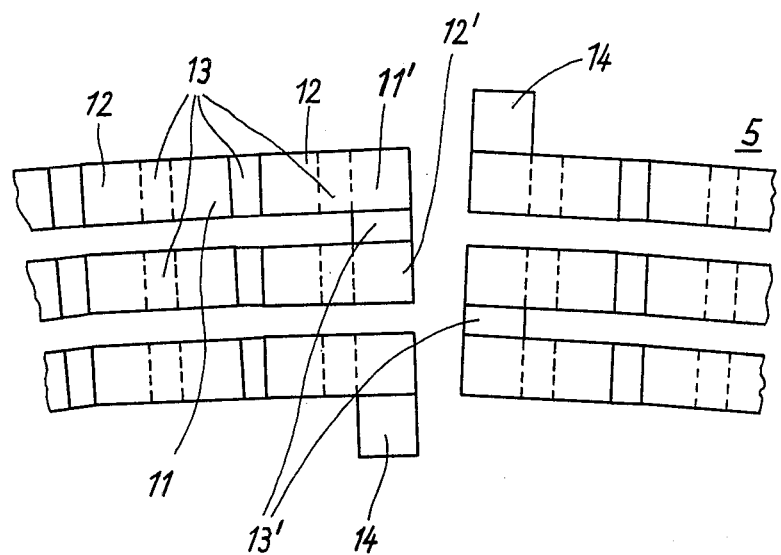
FIG. 5 represents a part of the thermoelectric generator as seen from above.

Thermoelectric generator 5 (FIGS. 1 and 2) is made up of a series of Peltier elements arranged according to FIG. 5, in a series of three concentric rows. The last semiconductor unit 11' of the outside row is connected to corresponding unit 12' of the central row, by means of a metallic contact 13'. Similarly, the last semiconductor unit of the central row is connected to the first semiconductor unit of the opposite type, arranged opposite in the inside row. The first and last of the Peltier elements connected in series, are each provided with an electrical contact 14 intended for connection with electronic module 8 and make it possible to transmit the power generated by the thermoelectric generator to a storage capacity unit 10, for example, a rechargeable battery or a cadmium-nickel battery.

Figure 6:
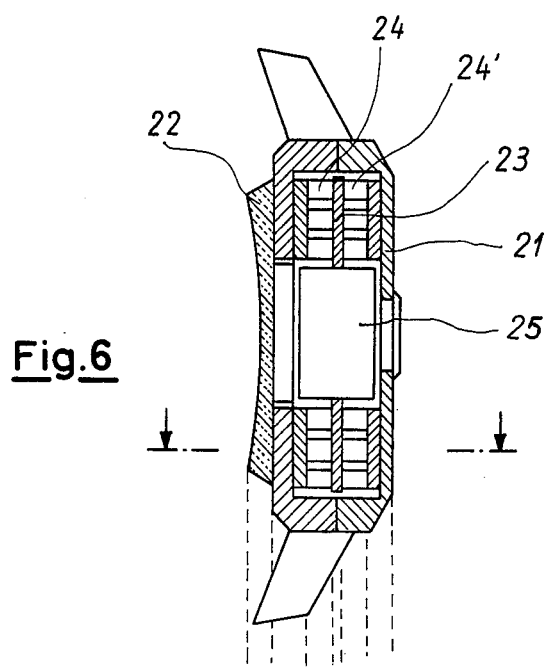
FIG. 6 illustrates another embodiment of a dithermal watch in accordance with the invention.

FIG. 6 illustrates another type of dithermal watch in accordance with the invention in which case 21 is made up of one or more metallic pieces, thermally uninsulated in relation to one another, and acting as a heat exchanger in contact with the ambient air. Case 21 is separated from the wearer's wrist by a thermal insulator 22.

Case 21 contains a mass 23 having a large thermal inertia and serving as a delay source. It can be made up of a metallic plate thermally insulated in relation to case 21, but in contact with one of the surfaces of the thermoelectric generator, for example, made up of two stages 24 and 24' of Peltier elements. To increase the volume of mass 23 and consequently its thermal inertia, it can be connected to timekeeping module 25, itself insulated in relation to case 21. This embodiment is represented in FIG. 6, the thermoelectric generator being made up of two superposed crowns separated by delay source 23.

Operation of the embodiment illustrated in FIG. 6 is as follows.

Figure 7:
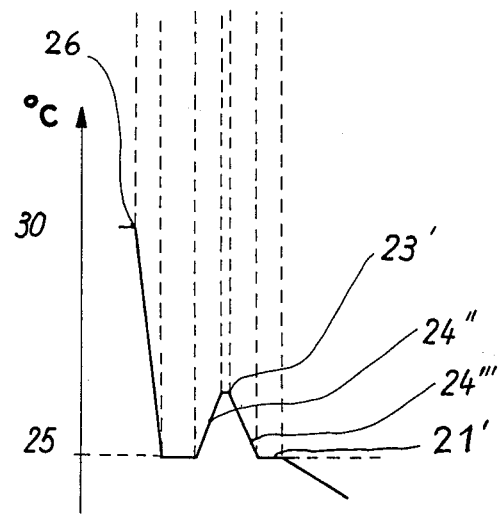
FIG. 7 is a diagram of the temperatures in the various parts of the watch according to FIG. 6.

The watch having been stopped for a sufficiently long time in an atmosphere at temperature To, case 21 and mass 23 are at this same temperature To. When the watch is brought into a space whose temperature is different, indicated as $T_1$, the heat exchanger made up by all or part of case 21, rapidly passes to this new temperature $T_1$, but the delay source made up of mass 23 practically remains at the same temperature To. The two heat exchangers in contact with thermoelectric generator 24 and/or 24' are therefore temporarily at different temperatures, producing the conversion of thermal energy into electrical energy intended to power timekeeping module 25. FIG. 7 schematically represents the diagram of temperatures corresponding to the different thermal levels of the dithermal watch according to FIG. 6, as a result of a sudden drop of the temperature of the ambient air. Stages 21' and 26 illustrate respectively the ambient air and the wrist of the wearer of the watch; stage 23' represents the mass with great thermal inertia acting as a delay source; inclined planes 24'' and 24''' illustrate the temperature distribution in the two groups of Peltier elements that constitute the thermoelectric generator.

Figure 8:
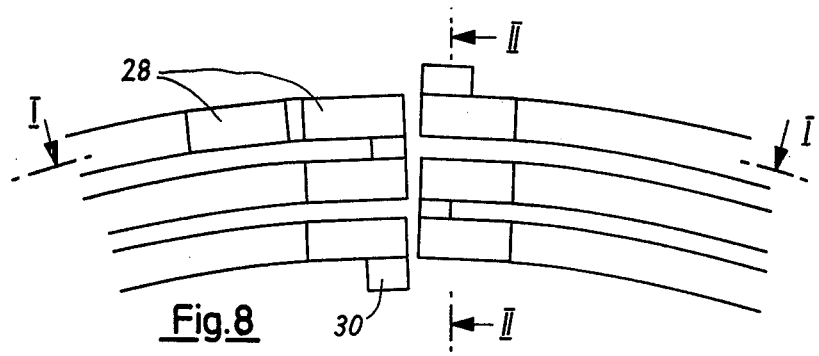
FIG. 8 is a top view representing a part of the thermoelectric generator of the watch according to FIG. 6.
Figure 9:
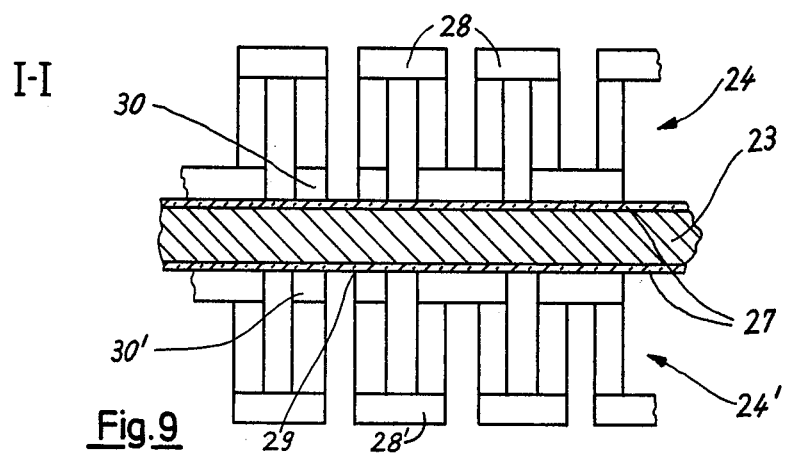
FIGS. 9 and 10 are section views along I — I and II — II of the thermoelectric generator according to FIG. 8.
Figure 10:
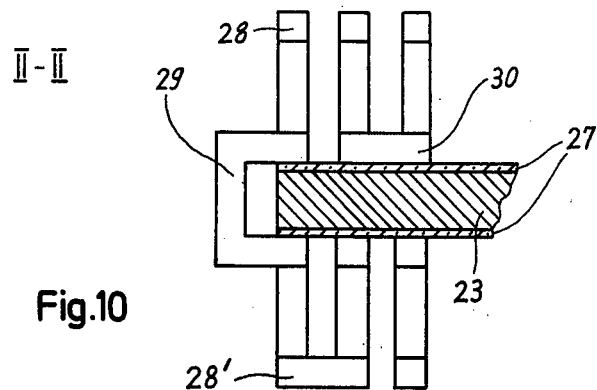

FIG. 8 is a top view representing an embodiment of the thermoelectric generator of FIG. 6, where Peltier elements 28 are placed in series as in FIG. 5 but in two superposed stages 24 and 24', as shown in greater detail by the views taken respectively along I—I and II—II of FIG. 8 which are shown in FIGS. 9 and 10, respectively.

The two stages 24 and 24' of the thermoelectric generator are separated by a metallic plate 23 which, combined with the unit of the timekeeping module 25 (FIG. 6) constitute a mass which acts as a delay source. Plate 23 is insulated from the surfaces of stages 24 and 24' of the thermoelectric generator by means of two thin layers 27 of electrical insulator having a good thermal conductivity.

The Peltier elements or couples 28 of stage 24 are connected in series with elements 28' of stage 24', the electrical connection being assured by a U-shaped metallic piece 29. The connection of the thermoelectric generator with the storage capacity unit (not shown) is made by metallic contacts 30 and 30'.

FIGS. 11 to 14 illustrate a variant of a dithermal watch of the general type discussed before in connection with FIGS. 1 and 2 in which the thermoelectric generator is made in the form of a thin or thick layer by using known photolithographic techniques.

The watch of FIG. 11 comprises a case 31. On its upper face, a window 32 makes it possible to see a display device 33, preferably of liquid crystals which provides an indication of time. On the inside there is represented on a larger scale, some thermoelectric elements 34 arranged radially in a crown on a thin layer.

FIG. 12 is a view in section of the watch of FIG. 11. Case 31 is made up of two parts 35 and 36 thermally insulated in relation to one another by means of an insulating gasket 37. A glass plate 38 supports a timekeeping module 39 and display device 33. Thermoelectric generator 34 placed flat on glass plate 38, is, on the one hand, in thermal contact by means of a ring 40 with the upper part 36 of case 31. Upper part 36 serves as a heat exchanger in thermal contact with the ambient air, which acts as the cold source. Additionally, thermoelectric generator 34 is in thermal contact with the lower part 35, the back of case 31. Lower part 35 acts as a heat exchanger itself in contact with the wearer's wrist and serving as the hot source.

FIG. 13 is a diagram illustrating the longitudinal distribution of temperature at the level of glass plate 38.

Figure 14:
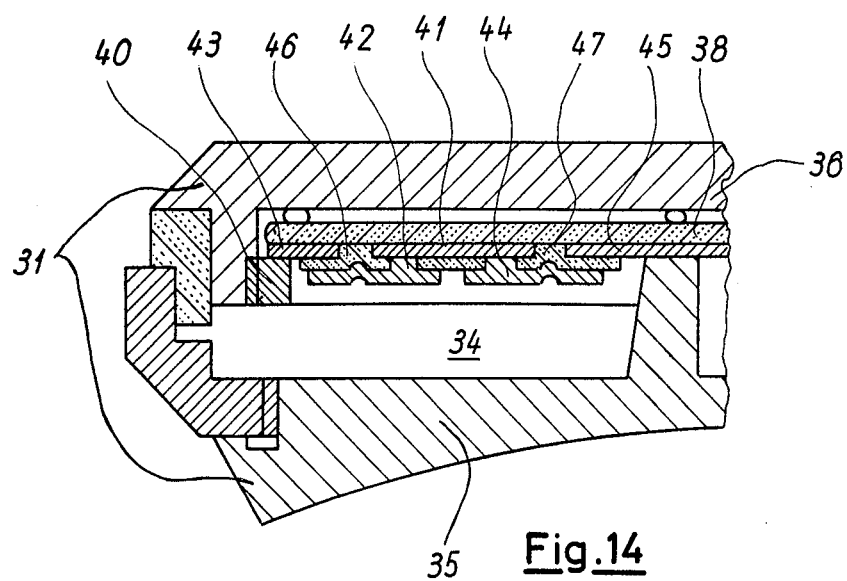
FIG. 14 is a view in section that illustrates in more detail the arrangement of the thermoelectric generator elements, and FIG. 15 schematically represents the recharging circuit of the electrical storage capacity unit.

FIG. 14 illustrates more in detail the arrangement of the elements 34 of the thermoelectric generator. One of the ends of a semiconductor rod 41 placed in a layer on glass plate 38 is in electric and thermal contact with a metallic bridge 42 which electrically connects it to the following semiconductor rod of the opposite type and thermally connects it by means of a thin insulator 46, an outside metal ring 43 and the ring 40 to the casebandbezel 36 of case 31, i.e., to the cold source. The other end of rod 41 is connected electrically and thermally to a metal bridge 44 which puts it in electrical contact with the opposite semiconductor preceding rod and in thermal contact with the lower part 35 of case 31, i.e., with the hot source, by means of a thin insulator 47 and an inside metal ring 45.

Thin layers of electric insulators 46 and 47 assure both electrical insulation and the transmission of the thermal flow to the semiconductor rod 41. These insulators can be made up of a layer of a material such as silicon dioxide used in thin or in thick layers.

Figure 15:
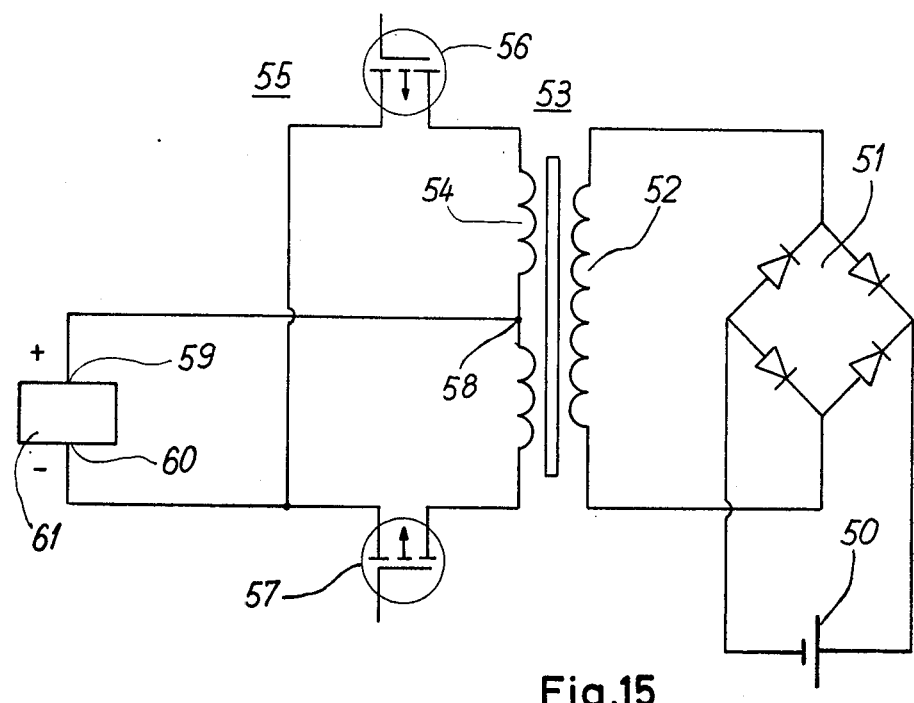

FIG. 15 schematically illustrates the recharging device of the storage capacity unit, made up, for example, of a cadmium-nickel battery 50. It comprises a diode rectifier bridge 51 connected, on the one hand, to the terminals of battery 50 and, on the other hand, to the secondary winding 52 of a transformer 53. This transformer is made up of a ferrite core having N1 windings on the primary 54 and N2 windings on the secondary 52.

Primary 54 of the transformer is connected to a chopping system 55 which comprises two MOS transistors 56 and 57 operated from an intermediate output of a frequency-division circuit, known in itself and not shown in the figure.

Center tap 58 of primary winding 54 is connected to the positive pole 59 of thermoelectric generator 61. The ends of the winding of primary 54 are connected by means of transistors 56 and 57 to the negative pole 60 of thermogenerator 61.

In operation, when transistor 56 is open, transistor 57 is blocked and vice versa, which makes it possible to give an alternating form to the voltage that appears between center tap 58 of primary 54 and its two ends. These transistors are of such a size that their conduction resistance is small, or at most of the same order of magnitude as the internal resistance of the thermoelectric generator.

Diode bridge 51 rectifies the output voltage of secondary 52. The system can start only if battery 50 is previously charged.

While various exemplary embodiments of a dithermal wrist watch in accordance with this invention have been particularly described, it should be apparent to those skilled in this art that various substitutions of alternatives and modifications may be made to these particular embodiments without departing from the true spirit and scope of this invention.

We claim:

1. An electric wrist watch comprising a case, a display device, a time-keeping unit, an electrical energy storage device and a thermoelectric generator, said wrist watch including at least two parts separated from each other by a thermally insulating joint and connected to the thermoelectric generator, the said at least two parts being arranged to be at least temporarily at different temperatures from one another and comprising portions of said case, the first of said parts forming a thermal exchanger serving as a cold source and positioned to be in contact with the ambient air when the wrist watch is worn, the second of said parts forming a thermal exchanger serving as a hot source and positioned to be in contact with the wrist of the wearer when the wrist watch is worn, the watch further including means within said case defining a ring-shaped space, said thermoelectric generator being mounted within the ring-shaped space, one surface of said thermoelectric generator being in thermal contact with an upper part of said case, the other surface of said thermoelectric generator being in thermal contact with the lower portion of said case.

2. An electric wrist watch in accordance with claim 1, wherein said thermoelectric generator comprises a plurality of Peltier-type thermoelements arranged in at least one circle, said thermoelements being connected in series and each thermoelement being approximately perpendicular to the surfaces of contact of said thermoelectric generator and said thermal exchangers.

3. An electric wrist watch in accordance with claim 1, wherein said thermoelectric generator comprises at least one series of thermoelements arranged radially flat on an annular surface of a thermal insulating element.

4. An electric wrist watch comprising a case, a display device, a time-keeping unit, an electrical energy storage device and a thermoelectric generator, said wrist watch including at least two parts thermally insulated from each other and connected to the thermoelectric generator, the said at least two parts being arranged to be at least temporarily at different temperatures from one another, one of said at least two parts being a thermal exchanger comprising said case and including insulating means for thermally insulating said case from the wearer's wrist when the wrist watch is worn, and the other of said at least two parts being a thermal exchanger comprising a mass having thermal inertia and acting as a delay source, said mass being mounted within said case and including insulating means for thermally insulating said mass with respect to said case.

5. An electric wrist watch in accordance with claim 4 wherein said mass comprises at least one metal plate in contact with one of the surfaces of said thermoelectric generator.

6. An electric wrist watch in accordance with claim 4 wherein said mass comprises said time-keeping unit and said electrical energy storage device, and wherein said insulating means thermally insulates said time-keeping unit and said electrical energy storage device from said case.

7. An electric wrist watch in accordance with claim 4 wherein said thermoelectric generator comprises two superposed stages, said stages connected in series, each stage having a surface in contact with said case and having another surface in contact with said mass having thermal inertia, the thermoelements of said thermoelectric generator being oriented perpendicularly in relation to the contact surfaces.

8. An electric wrist watch comprising a case, means mounting within said case a display device, a time-keeping unit, an electrical energy storage device and a thermoelectric generator, a thermal insulating joint separating said case into two portions thermally insulated from one another, one of said case portions being an upper portion forming a thermal exchanger serving as a cold source and positioned to be in contact with the ambient air when the wrist watch is worn, the other of said case portions being a lower portion forming a thermal exchanger serving as a hot source and positioned to be in contact with the wrist of the wearer when the watch is worn, said thermoelectric generator generating an electric power in response to a temperature difference between said upper and lower portions of said case.

9. An electric wrist watch comprising a case, means mounting within said case a display device, a time-keeping unit, an electrical energy storage device and a thermoelectric generator, said case comprising a first thermal exchanger and including insulating means for thermally insulating said case from the wearer's wrist when the wrist watch is worn, a second thermal exchanger comprising a mass having thermal inertia, means mounting said mass within said case and insulating means thermally insulating said mass from said surrounding case, and both said first and second thermal exchangers being thermally connected to said thermoelectric generator, whereby said thermoelectric generator generates electric power in response to temporary temperature differentials between said two thermal exchangers.

* * * * *